(12) United States Patent
Lai et al.

(10) Patent No.: US 11,171,114 B2
(45) Date of Patent: Nov. 9, 2021

(54) DIE STACK WITH CASCADE AND VERTICAL CONNECTIONS

(71) Applicant: Intel Corporation, Santa Clara, CA (US)

(72) Inventors: Min-Tih Ted Lai, Folsom, CA (US); Florence R. Pon, Folsom, CA (US); Yuhong Cai, Folsom, CA (US); John G. Meyers, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/780,506

(22) PCT Filed: Dec. 2, 2015

(86) PCT No.: PCT/US2015/063346
§ 371 (c)(1),
(2) Date: May 31, 2018

(87) PCT Pub. No.: WO2017/095401
PCT Pub. Date: Jun. 8, 2017

(65) Prior Publication Data
US 2018/0366441 A1   Dec. 20, 2018

(51) Int. Cl.
*H01L 23/00*   (2006.01)
*H01L 25/00*   (2006.01)
(Continued)

(52) U.S. Cl.
CPC .......... *H01L 25/0657* (2013.01); *H01L 24/96* (2013.01); *H01L 25/50* (2013.01);
(Continued)

(58) Field of Classification Search
CPC ..... H01L 24/48; H01L 24/49; H01L 25/0657; H01L 2224/73265; H01L 2224/32145;
(Continued)

(56) References Cited

U.S. PATENT DOCUMENTS 6,621,155 B1 *   9/2003   Perino ................. H01L 23/3128
257/686
7,327,038 B2 *   2/2008   Kwon .................... H01L 24/49
257/777

(Continued)

FOREIGN PATENT DOCUMENTS

KR   1020120006352 A   1/2012
KR   1020150058469 A   5/2015
(Continued)

OTHER PUBLICATIONS

"International Application Serial No. PCT/IJS2015/063346, International Search Report dated Aug. 8, 2016", 3 pgs.
(Continued)

*Primary Examiner* — Mohsen Ahmadi
(74) *Attorney, Agent, or Firm* — Schwegman Lundberg & Woessner

(57) ABSTRACT

An electronic assembly includes a plurality of electronic die arranged into shingles, each shingle having a multiple offset stacked die coupled by cascading connections. Each shingle is arranged in a stack of shingles with alternate shingles having die stacked in opposite directions and offset in a zigzag manner to facilitate vertical electrical connections from a top of the electronic assembly to a bottom die of each shingle.

7 Claims, 5 Drawing Sheets

(51) Int. Cl.
*H01L 25/065* (2006.01)
*H01L 21/56* (2006.01)

(52) U.S. Cl.
CPC .. *H01L 21/568* (2013.01); *H01L 2224/04105* (2013.01); *H01L 2224/32145* (2013.01); *H01L 2224/46* (2013.01); *H01L 2224/4801* (2013.01); *H01L 2224/48011* (2013.01); *H01L 2224/48091* (2013.01); *H01L 2224/48147* (2013.01); *H01L 2224/48227* (2013.01); *H01L 2224/73265* (2013.01); *H01L 2224/82039* (2013.01); *H01L 2224/92247* (2013.01); *H01L 2225/06506* (2013.01); *H01L 2225/06548* (2013.01); *H01L 2225/06562* (2013.01); *H01L 2225/06582* (2013.01); *H01L 2924/14* (2013.01); *H01L 2924/15311* (2013.01); *H01L 2924/181* (2013.01)

(58) Field of Classification Search
CPC . H01L 2225/06506; H01L 2225/06562; H01L 2224/46; H01L 2224/04042; H01L 2224/494–4945; H01L 2224/08135–08148; H01L 25/043; H01L 25/074; H01L 25/0756; H01L 25/117; H01L 25/112; H01L 25/071
See application file for complete search history.

(56) References Cited

U.S. PATENT DOCUMENTS

| | | | | |
|---|---|---|---|---|
| 7,352,057 | B2* | 4/2008 | Grate | H01L 24/06 257/686 |
| 7,855,446 | B2* | 12/2010 | Nishiyama | H01L 25/0657 257/686 |
| 8,026,586 | B2* | 9/2011 | Kim | H01L 23/3128 257/686 |
| 8,331,121 | B2* | 12/2012 | Hong | G11C 5/06 365/51 |
| 8,390,114 | B2* | 3/2013 | Kim | H01L 24/49 257/724 |
| 8,415,808 | B2* | 4/2013 | Liao | H01L 25/0657 257/777 |
| 8,513,793 | B2* | 8/2013 | Han | H01L 24/49 257/686 |
| 8,729,688 | B2* | 5/2014 | Jung | H01L 23/49816 257/686 |
| 8,823,165 | B2* | 9/2014 | Haba | H01L 25/18 257/723 |
| 9,177,863 | B2* | 11/2015 | Gillingham | H01L 24/92 |
| 2006/0055018 | A1* | 3/2006 | Sekiguchi | H01L 25/0657 257/686 |
| 2006/0076690 | A1* | 4/2006 | Khandros | H01L 23/13 257/777 |
| 2008/0048301 | A1* | 2/2008 | Wang | H01L 23/49506 257/666 |
| 2008/0150111 | A1* | 6/2008 | Hiller | H01L 24/49 257/686 |
| 2008/0150158 | A1* | 6/2008 | Chin | H01L 24/49 257/777 |
| 2008/0174000 | A1 | 7/2008 | Chen et al. | |
| 2009/0032969 | A1* | 2/2009 | Pilla | H01L 24/49 257/777 |
| 2009/0065948 | A1 | 3/2009 | Wang | |
| 2009/0085223 | A1* | 4/2009 | Nishiyama | H01L 23/3121 257/777 |
| 2009/0108470 | A1* | 4/2009 | Okada | H01L 29/0657 257/777 |
| 2010/0261312 | A1* | 10/2010 | Maki | H01L 24/95 438/109 |
| 2011/0031600 | A1* | 2/2011 | Kim | H01L 23/3128 257/686 |
| 2012/0043671 | A1 | 2/2012 | Nishiyama et al. | |
| 2013/0286707 | A1* | 10/2013 | Crisp | G11C 5/04 365/63 |

FOREIGN PATENT DOCUMENTS

| | | |
|---|---|---|
| TW | 201731068 A | 9/2017 |
| WO | WO-2017095401 A1 | 6/2017 |

OTHER PUBLICATIONS

"International Application Serial No. PCT/US2015/063346, Written Opinion dated Aug. 8, 2016", 11 pgs.
"Taiwanese Application Serial No. 105135313, Response field Aug. 6, 2020 to Office Action dated May 5, 2020", w English translation, 73 pgs.
"Taiwanese Application Serial No. 105135313, Office Action dated May 5, 2020", 6 pgs.

* cited by examiner

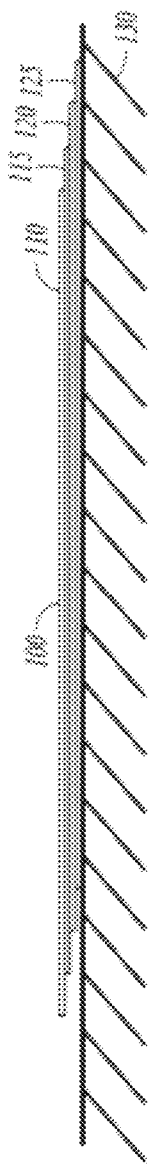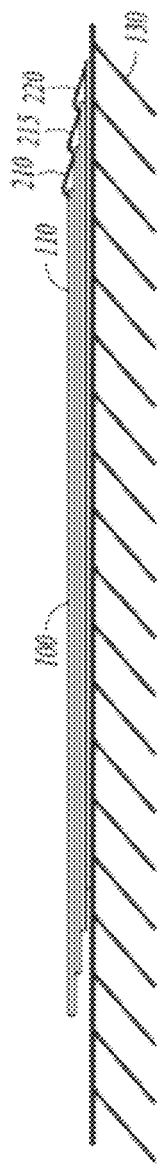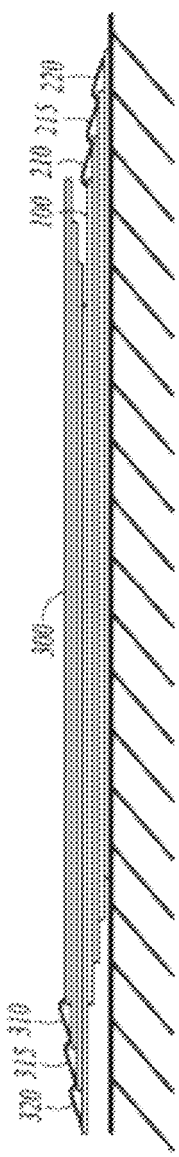

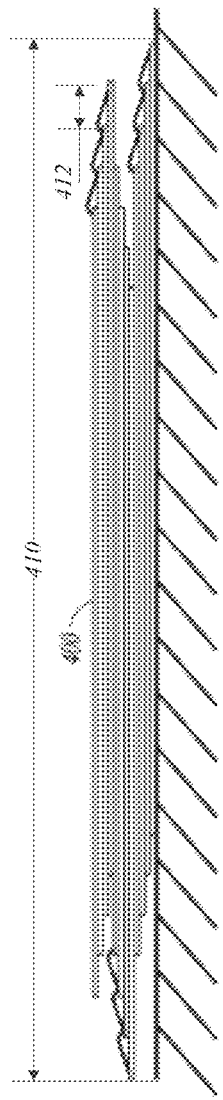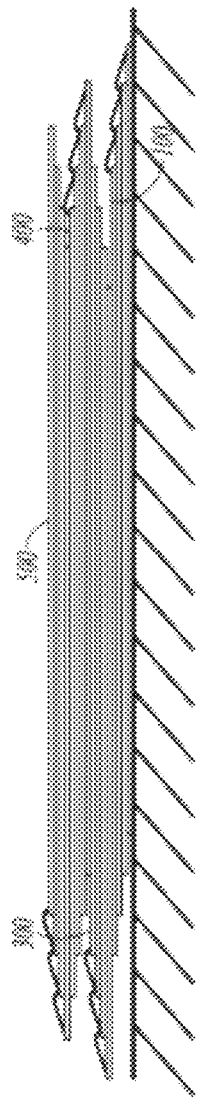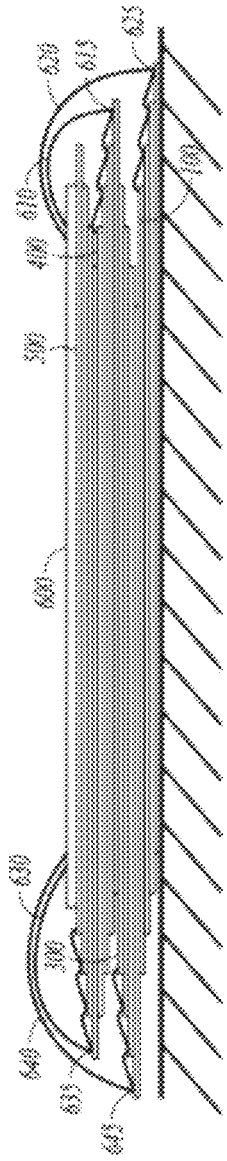

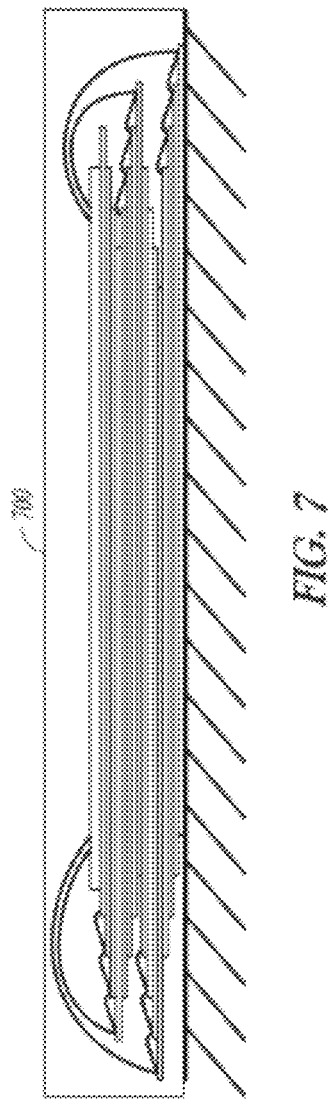
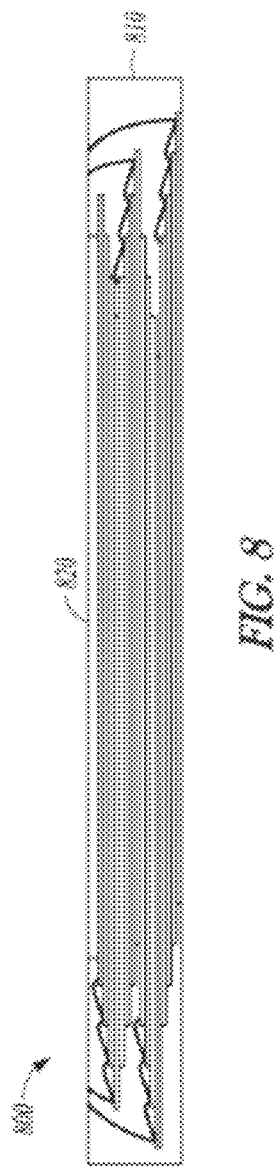
FIG. 7
FIG. 8

DIE STACK WITH CASCADE AND VERTICAL CONNECTIONS

CLAIM OF PRIORITY

This patent application is a U.S. National Stage Application under 35 U.S.C. 371 from International Application No. PCT/US2015/063346, filed Dec. 2, 2015, published as WO 2017/095401, which is incorporated herein by reference.

TECHNICAL FIELD

Embodiments described herein generally relate to stacked die packages, and more particularly to overlapping stacked die packages that include conductive columns.

BACKGROUND ART

Mobile products (e.g., mobile phones, smart phones, tablet computers, etc.) are very restricted in available space because there are typically severe limitations for chip/package area and height (among other physical and electrical parameters). Therefore, it is extremely important to reduce the size of electronic components (e.g., packaged chips or discrete devices, integrated passive devices (IPDs), surface mount devices (SMDs), etc.) on a system board (e.g., printed circuit board PCB).

Conventional stacked electronic components typically require relatively large z-height making them more difficult to fit inside a housing of mobile products, especially when several chips, IPDs or SMDs need to be assembled and/or stacked one on top of another. In addition, as with most electronic components, there is usually a goal of improved electrical performance.

There are two existing packaging methods for high die count stacked die packages. One method forms a wire bond based package in which substrate and over mold add extra z-height to the package. In addition, wire bond based packages are also typically limited in their performance because of the number and length of the wires that are utilized in the packages.

Another existing packaging method for high die count stacked die packages utilizes Thru Silicon Via (TSV) technology. High die count stacked die packages that utilize TSV usually have relatively high speed. However, z-height reduction is still difficult with TSV. In addition, the vias that are formed using TSV technology often use up valuable space on silicon. There are also usually relatively high manufacturing costs that are associated with utilizing TSV technology making it more expensive to produce high die count stacked die packages using TSV technology. The typical z-height of a conventional 16 Die BGA stacked die package is 1.35 mm where each die is thinned to 35 um.

BRIEF DESCRIPTION OF THE DRAWINGS

FIG. 1 is a side view of a shingle having multiple offset stacked die according to an example embodiment.

FIG. 2 is a side view of the shingle of FIG. 1 with cascade wirebonds between adjacent die in the shingle according to an example embodiment.

FIG. 3 is a side view of two shingles with cascade wirebonds arranged in a zig-zag pattern according to an example embodiment.

FIG. 4 is a side view of three shingles with cascade wirebonds arranged in a zig-zag pattern according to an example embodiment.

FIG. 5 is a side view of four shingles with cascade wirebonds arranged in a zig-zag pattern according to an example embodiment.

FIG. 6 is a side view of the four shingles of FIG. 5 with vertical wirebonds extending from a top bonding surface to a bottom die in each shingle according to an example embodiment.

FIG. 7 is a side view of the four shingles of FIG. 6 including a molding formed around the shingles and wirebonds according to an example embodiment.

FIG. 8 is a side view of the four shingles of FIG. 7 with bonding material removed and including a redistribution layer coupled to the vertical wirebonds according to an example embodiment.

DESCRIPTION OF EMBODIMENTS

Figure 9:
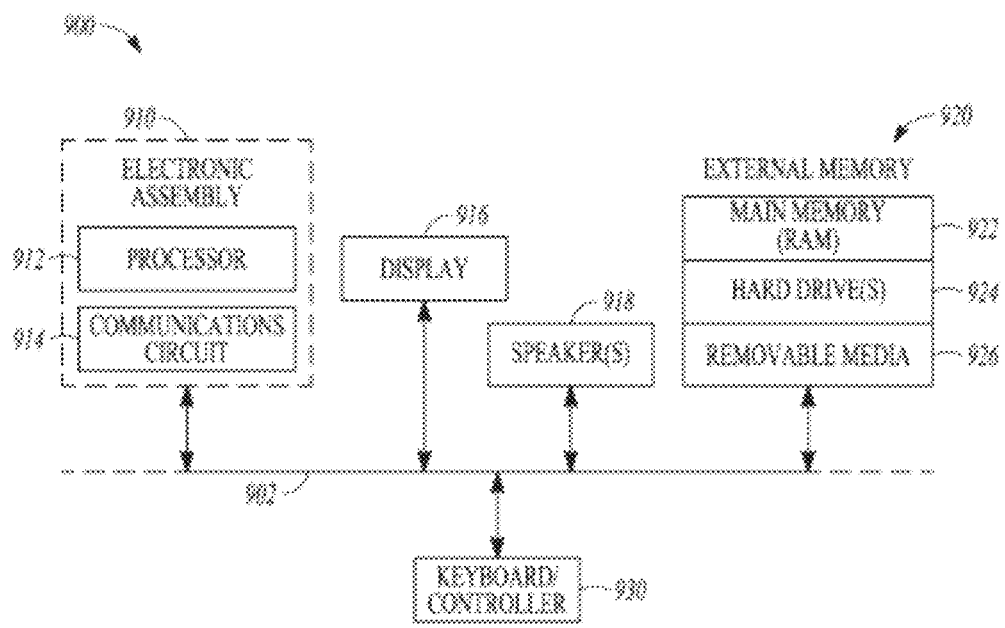
FIG. 9 is block diagram of an electronic apparatus that includes the electronic assemblies and/or the electronic packages described herein.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," "x" or "y" as used in this application is defined dimensions and directions with respect to a plane parallel to the conventional plane or surface of a wafer or substrate, regardless of the orientation of the wafer or substrate. The term z-height, refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic assemblies, packages and methods described herein may address the drawbacks that are associated with using wire bond packaging technology and TSV technology to form high die count stacked die packages. In addition, electronic assemblies, packages and methods described herein may increase the electrical performance of high die count stacked die packages.

The electronic assemblies, packages and methods described herein may provide some benefits over using conventional TSV technology to form high die count stacked die packages.

The silicon utilization efficiency of the electronic assemblies, packages and methods described herein may be higher than TSV technology because TSV technology fabricates vias through peripheral areas of silicon. This need to fabricate openings in the silicon to create openings for via formation uses valuable space on the silicon and increases the fabrication costs associated with forming high die count stacked die packages. The electronic assemblies, packages and methods described herein do not require any type of fabrication to create openings in the silicon for vias.

The electronic assemblies, packages and methods described herein may utilize existing wire bond equipment to create conductive columns to couple zig-zag stacked shingles of die. This ability to use existing wire bond equipment may reduce the costs that are associated with fabricating the electronic assemblies, packages and methods described herein.

The electronic assemblies, packages and methods described herein may provide improved electrical performance. The overall package size may be reduced because (i) the X-Y space on the substrate that is usually used for wire bonding may be saved and the extra over molding that were previously used for the conductive wires that are used in wire bonding may be eliminated to reduce the z-height. The electrical performance may be better because the conductive columns are shorter based on the zig-zag arrangement of shingles and the use of cascade connections between die in each shingle. Shorter conductive columns result in less overall wire length, saving on cost of precious metals utilized for metal wirebonding.

Stacks of staggered die are used to form multiple shingles. The shingles are stacked and offset from each other in a zig-zag manner to allow formation of vertical connections to a bottom die on each shingle. Cascade connections may be used to connect adjacent die in each shingle. The use of the zig-zag stacking of shingles, vertical connections, and cascade connections allows larger stacks of die while minimizing a y-dimension. The term "vertical connections" refers to a connection that generally traverses a z-height but may also have an x or y-dimension component. Such a vertical connection need not be perpendicular and if formed by wirebonding, will generally have some angle to perpendicular at least partially depending on the length of the resulting connection. In some embodiments, one or more shingles includes one or more die. If a shingle has one die, cascade connections may optionally not be utilized.

FIGS. 1-8 are side views illustrating a method of stacking and connecting die and shingles. Reference numbers are used for the same elements in each of FIGS. 1-8. FIG. 1 is a side view of a shingle 100 having multiple offset stacked die 110, 115, 120, and 125 according to an example embodiment. While four die are shown in each shingle, and four shingles are shown, the number of such die and shingles may vary allowing stacks of die up to and exceeding 32 die. The die may also be of varying thickness, corresponding to a z-direction. The side view illustrates a y-direction of the stack of shingles. The stacked die are supported by a carrier 130 to provide a solid platform for handling during formation of the shingle.

The die 110, 115, 120, and 125 are staggered in one embodiment such that a suitable area of each die is exposed on a top surface to facilitate formation of connections 210, 215, and 220 as illustrated in FIG. 2. The exposed area, referred to as a stagger distance, may be limited in size so as to allow such connections to be made in a reliable manner yet minimizing a total y-direction dimension. In one embodiment, a standard wirebonding method may be used to form the connection 210, 215, and 220 in a cascade manner. The connections may be referred to as cascade connections that connect adjacent die 110, 115, 120, and 125 in a shingle 100 to each other. Note that there may be multiple such cascade connections extending in an x-direction between each adjacent die, all as represented by connections 210, 215, and 220 and other connections shown in further figures.

FIG. 3 is a side view of two shingles 100 and 300 with cascade wirebonds 210, 215, and 220, and 310, 315, and 320 respectively arranged in a zig-zag pattern according to an example embodiment. The zig-zag pattern is exemplified by the shingle 300 comprising multiple staggered stacked die with the stagger being in the opposite direction of the stagger of die in shingle 100. Further, the shingle 300 is offset. The amount of shingle offset is related to the number of shingles in the final package, to allow vertical connections to be formed to a bottom die of each shingle. The purpose and amount of adjacent shingle offset decreases with each additional shingle as illustrated in succeeding figures. In one embodiment, the shingle offset is a multiple of the stagger distance and related to the amount of area suitable for forming vertical connections.

FIG. 4 is a side view of three shingles 100, 300, and 400 with cascade wirebonds arranged in a zig-zag pattern according to an example embodiment. Shingle 400 is stacked on top of shingle 300 with exposed die due to staggering occurring opposite that of the exposed die of shingle 300, but the same as that in shingle 100. Thus, the staggering is opposite for adjacent shingles. Shingle 400 is also offset from shingle 100 by a reduced amount. Note that amount of shingle offset is a function of the total number of shingles to be stacked. With a larger number of shingles, a larger initial shingle offset is used than with a four shingle stack, with the offset decreasing for each additional shingle.

Using the zigzag stacking of shingles, a y-dimension growth 410 of $(T/S) \times O$, where T is the total number of die, S is the number of die per shingle, and O is the overhang 412 (also referred to as the stagger distance above) may be obtained. Note that in some embodiments, S may vary from one to four or more. In prior methods of utilizing wirebonding on a single large stack of die, the y-dimension growth is simply $T \times O$, which may be much larger than that obtained with the zigzag stacking of shingles.

FIG. 5 is a side view of four stacked shingles 100, 300, 400 and 500 with cascade wirebonds arranged in a zig-zag pattern according to an example embodiment. Shingle 500 is stacked on top of shingle 400 with exposed die due to staggering occurring opposite that of the exposed die of shingle 400, but the same as that in shingle 300. Thus, the staggering is opposite for adjacent shingles. Shingle 500 is also offset from shingle 100 by a reduced amount. As seen in FIG. 5, each shingle has bottom die that is exposed in a manner suitable for forming a vertical connection.

To optimize z-dimension utilization, the shingle offsets of the zigzag stack result in a single stagger distance of each bottom die of each shingle being exposed for vertical connection. In FIG. 5, such a zigzag stagger is illustrated by the right most side of the bottom die of shingle 100 being exposed for vertical connection, due to shingle 400 being offset one stagger distance to the left of the right most side of shingle 100. Shingle 500 is also offset, allowing vertical access to the right most die of shingle 400. The same offsets operate to expose the left sides of shingle 300, with successive shingles having decreasing offsets to provide such exposures and allow vertical connections to be made to the bottom die of each shingle.

FIG. 6 is a side view of the four shingles of FIG. 5 with vertical wirebonds extending from a top bonding surface to a bottom die in each shingle according to an example embodiment. In one embodiment, a dummy bonding surface 600 may be formed on top of or otherwise supported by the top shingle 500. Wirebonds may be formed to the bottom die of each shingle using a standard wirebonding process. On the right side of the zigzag shingle stack, wires are formed to the vertically exposed bottom die of shingle stacks that are staggered with vertically exposed shingles. A wire 610 is formed extending to an exposed area 615 of the bottom die of shingle 400. A wire 620 is formed extending to an exposed area 625 of the bottom die of shingle 100. On the left side of the zigzag shingle stack, wires are formed to the vertically exposed bottom die of shingle stacks that are staggered with vertically exposed shingles. A wire 630 is formed extending to an exposed area 635 of the bottom die of shingle 500. A wire 640 is formed extending to an exposed area 645 of the bottom die of shingle 300.

FIG. 7 is a side view of the four shingles of FIG. 6 including a molding 700 formed around the shingles and wirebonds according to an example embodiment. As an example, the mold 700 may surround the package shingle stack and be formed of a thermoset molding compound, such as an epoxy (among other types of materials).

FIG. 8 is a side view of the four shingles of FIG. 7 forming a package 800 with some bonding material 700 removed and the carrier 130 also optionally removed. The remaining bonding material 810 helps support and protect the stacked shingles. The dummy bonding surface 600 has also been removed. Grinding may be used for such removal in some embodiments to expose the top die of the top shingle 500. A redistribution layer 820 may be formed and coupled to the vertical wirebonds to provide desired electrical connections via the vertical wirebonds, cascade wirebond connections and conduction paths on individual die to form the package 800.

Note that the vertical connections created by the vertical wirebonds may not have as high of an aspect ratio as shown in the FIGS., as they are not drawn to scale. An example aspect ratio of the vertical columns may range from 1 to 20 or higher and may vary along their length, especially when wirebonding is used to form the columns. Vertical columns extending to different die of different shingles may have different aspect ratios. A higher aspect ratio may be desired to minimize the length of package 800, as a higher aspect ratio may allow shorter y-dimension stagger and offset distances.

In a further embodiment, the mold 700 may be formed prior to formation of the vertical columns. Vias may then be formed through the mold, such as by drilling, and filled with conductive material to form vertical columns with very high aspect ratios. In some embodiments, the die to which the vertical columns are coupled may have conductive pads to facilitate the electrical connection to the columns. The columns may have a circular cross section in one embodiment, or may have a polygon shape in further embodiments.

An electronic apparatus 900 may include one or more packages 800 that may be bonded together. Examples of an electronic apparatus include, but are not limited to, personal computers, tablet computers, mobile telephones, game devices, MP3 or other digital music players, etc. In this example, electronic apparatus 900 comprises a data processing system that includes a system bus 902 to couple the various components of the electronic apparatus 900. System bus 902 provides communications links among the various components of the electronic apparatus 900 and may be implemented as a single bus, as a combination of busses, or in any other suitable manner.

An electronic apparatus 900 as described herein may be coupled to system bus 902. The electronic apparatus 900 may include any circuit or combination of circuits. In one embodiment, the electronic apparatus 900 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 900 are a custom circuit, an application-specific integrated circuit (ASIC), or the like, such as, for example, one or more circuits (such as a communications circuit 914) for use in wireless devices like mobile telephones, tablet computers, laptop computers, two-way radios, and similar electronic systems. The IC can perform any other type of function.

The electronic apparatus 900 may also include an external memory 920, which in turn may include one or more memory elements suitable to the particular application, such as a main memory 922 in the form of random access memory (RAM), one or more hard drives 924, and/or one or more drives that handle removable media 926 such as compact disks (CD), flash memory cards, digital video disk (DVD), and the like.

The electronic apparatus 900 may also include a display device 916, one or more speakers 918, and a keyboard and/or controller 930, which can include a mouse, trackball, touch screen, voice-recognition device, or any other device that permits a system user to input information into and receive information from the electronic apparatus 900.

Figure 10:
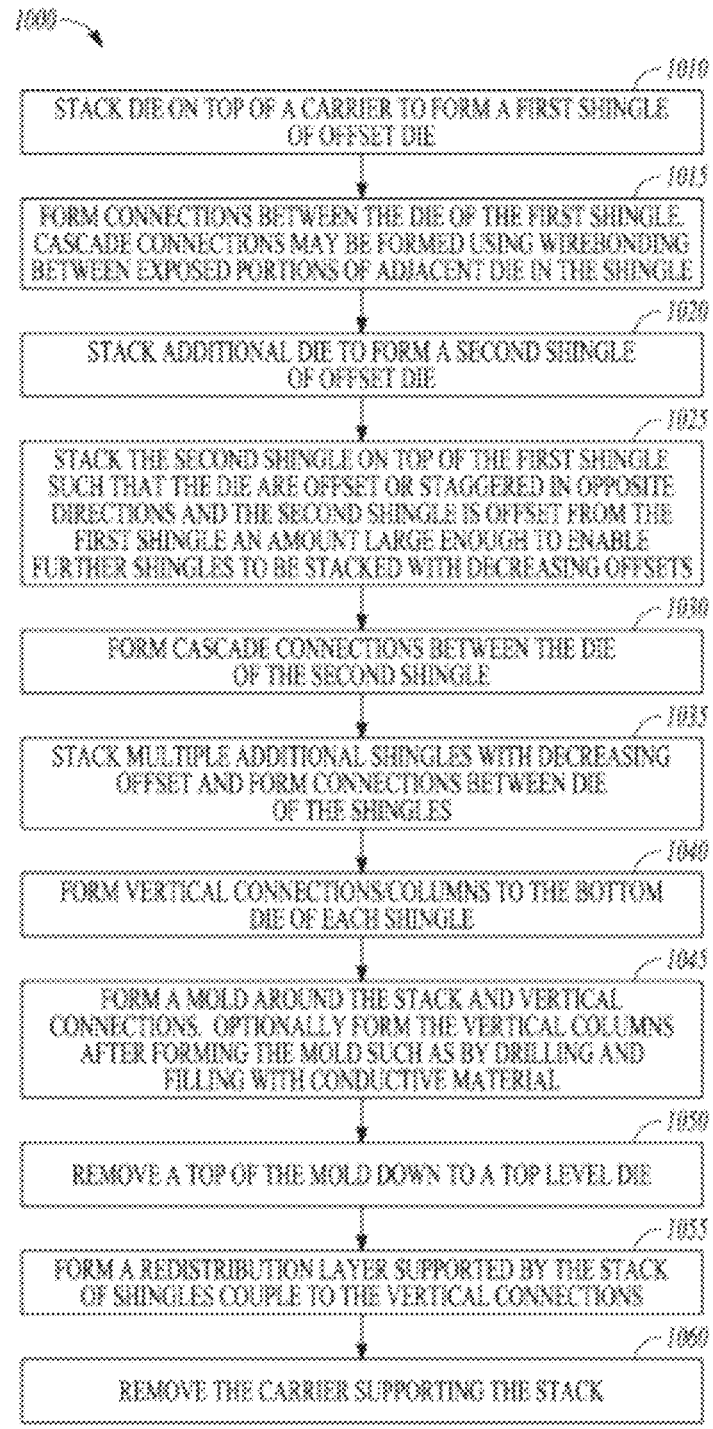
FIG. 10 is a flowchart illustrating a method of forming a zigzag stack of die shingles according to an example embodiment.

FIG. 10 is a flowchart illustrating a method 1000 of forming a zigzag stack of die shingles according to an example embodiment. Method 1000 begins by stacking die at 1010 on top of a carrier to form a first shingle of offset die. At 1015, connections between the die of the first shingle are formed. In one embodiment, the connections are cascade connections formed using wirebonding between exposed portions of adjacent die in the shingle. The die may be stacked in a staggered manner to facilitate the inter-die connections. At 1020, additional die are stacked to form a second shingle of offset die.

At 1025, the second shingle is stacked on top of the first shingle such that the die are offset or staggered in opposite directions and the second shingle is offset from the first shingle an amount large enough to enable further shingles to be stacked with decreasing offsets. At 1030, cascade connections are formed between the die of the second shingle.

At 1035, multiple additional shingles may be stacked with decreasing offset and forming connections between die of the shingles. Vertical connections to the bottom die of each shingle may be formed at 1040. At 1045, a mold may be formed around the stack and a top of the mold may be removed at 1050 down to a top level die. Optionally, the vertical columns may be formed after forming the mold such as by drilling and filling with conductive material. A redistribution layer supported by the stack of shingles may be formed at 1055 to couple to the vertical connections. The carrier supporting the stack may also be removed at 1060.

To better illustrate the electronic assemblies, electronic packages and methods disclosed herein, a non-limiting list of examples is provided herein:

Example 1 includes an electronic assembly that includes a plurality of electronic die arranged into shingles. Each shingle has multiple offset stacked die coupled by cascading connections. Each shingle is arranged in a stack of shingles with alternate shingles having die stacked in opposite directions and offset in a zigzag manner to facilitate vertical electrical connections from a top of the electronic assembly to a bottom die of each shingle.

Example 2 includes the electronic assembly of example 1, wherein the zigzag manner of stacking shingles continue a pattern of decreasing offsets facilitating alternating opposite vertical connections to the bottom die of each successive shingle.

Example 3 includes the electronic assembly of any one of examples 1-2, wherein a y-dimension growth of the electronic assemble is defined by $(T/S)*O$, where T is the total number of die, S is the number of die per shingle, and O is the overhang of each die and offset of each shingle.

Example 4 includes the electronic assembly of example 3 wherein S is at least four.

Example 5 includes the electronic assembly of any of examples 3-4 wherein there are at least four shingles.

Example 6 includes an electronic assembly including a plurality of offset zigzag shingle stacks of die such that a portion of each bottom die in each shingle stack die is vertically exposed. A plurality of cascade electrical connections extend between adjacent die in each shingle stack. A plurality of vertical connections are coupled to the vertically exposed portions of the bottom die of each shingle stack.

Example 7 includes the electronic assembly of example 6 wherein a y-dimension growth of the electronic assemble is defined by $(T/S)*O$, where T is the total number of die, S is the number of die per shingle, and O is the overhang of each die and offset of each shingle.

Example 8 includes an electronic assembly including a first shingle having multiple stacked offset die coupled via wirebonds on a first end of the first shingle. A second shingle is supported by the first shingle and has multiple stacked offset die coupled via wirebonds on a first end of the second shingle opposite the first end of the first shingle. An electrical redistribution layer is supported by the second shingle. Multiple conductive vertical columns couple the redistribution layer to the first and second shingles on the first ends of the shingles.

Example 9 includes the electronic assembly of example 8 and further includes multiple additional shingles supported by the first and second shingles, each of the multiple additional shingles having multiple stacked offset die coupled via wirebonds on one end and conductive vertical columns on another end such that all the shingles are arranged in a zig-zag pattern, each extending in a y-direction sufficient to make room for at least one vertical column.

Example 10 includes the electronic assembly of example 9 wherein each shingle comprises at least four die offset from each other a distance sufficient to facilitate top side cascade bonds between adjacent die.

Example 11 includes the electronic assembly of example 9 wherein adjacent shingles have die offset in opposite directions.

Example 12 includes the electronic assembly of example 11 wherein die are offset from each other a distance sufficient to facilitate top side cascade bonds between adjacent die, and wherein alternate shingles are offset from other shingles a distance sufficient to facilitate a vertical wire bond to the redistribution layer.

Example 13 includes the electronic assembly of example 12 wherein the offset of the die and shingles from each other are minimized to reduce the Y dimension of the electronic assembly yet still facilitate the respective wirebonds.

Example 14 includes the electronic assembly of any of examples 7-12 and further includes a mold surrounding the vertical conductive columns between the redistribution layer and the shingles.

Example 15 includes the electronic assembly of example 14 wherein the conductive vertical columns are through mold vias.

Example 16 includes the electronic assemble of any of examples 7-12 wherein shingle has multiple vertical conductive columns extending in an x-direction without increasing the y-dimension, such multiple vertical columns coupled to the redistribution layer.

Example 17 includes the electronic assembly of any of examples 8-13, wherein the conductive vertical columns have a cylindrical cross section formed by wirebonding.

Example 18 includes an electronic assembly including a first shingle having multiple stacked offset die coupled via wirebonds on a first end of the first shingle. A second shingle is supported by the first shingle and has multiple stacked offset die coupled via wirebonds on a first end of the second shingle opposite the first end of the first shingle. An electrical redistribution layer is supported by the second shingle. A means is provided for coupling the redistribution layer to the first and second shingles on second ends of the shingles opposite the first ends of the shingles.

Example 19 includes the electronic assembly of example 18 wherein the offset of the die and shingles from each other are minimized to reduce the Y dimension of the electronic assembly.

Example 20 is a method including stacking die to form a first shingle of offset die, forming connections between the die of the first shingle, stacking die to form a second shingle of offset die, stacking the second shingle on top of the first shingle such that the die offset in opposite directions and the second shingle is offset from the first shingle an amount large enough to enable further shingles to be stacked with decreasing offsets, and forming connections between the die of the second shingle.

Example 21 includes the method of example 20 and further includes stacking multiple additional shingles with decreasing offset and forming connections between die of the shingles.

Example 22 includes the method of example 21 and further including forming vertical connections to the bottom die of each shingle.

Example 23 includes the method of example 22 and further includes forming a redistribution layer supported by the stack of shingles to couple to the vertical connections.

Example 24 includes the method of example 23 and further includes removing a carrier supporting the stack.

Example 25 includes the method of any of examples 20-24 and further includes forming a mold around the stack.

Example 26 includes the method of example 25 and further includes removing a top of the mold down to a top level die.

Example 27 includes the method of example 26 and further includes forming a redistribution layer on top of the stack of shingles and the vertical connections.

Example 28 includes a method of increasing integrated circuit die density in a package. The method includes forming multiple shingles of die, each shingle comprising multiple stacked die that are staggered to facilitate inter-die connections, and stacking the shingles such that a direction of die stagger of each adjacent shingle is opposite each other and wherein the stacked shingles are offset from each other a distance to facilitate vertical connections to a bottom die of each shingle.

Example 29 includes the method of example 28 and further includes forming vertical connections to the bottom die of each shingle, forming a mold about the vertical connections, and forming a redistribution layer supported by the stack of shingles.

Example 30 includes the method of example 29 and further includes electrically coupling the redistribution layer to the vertical connections.

Example 31 includes the method of any of examples 28-30 wherein forming multiple shingles of die comprising forming inter-die connections between adjacent die of each shingle prior to adding a further shingle to the stack of shingles.

Example 32 is an electronic assembly that includes a plurality of electronic die arranged into shingles, each shingle having at least one die. Each shingle is arranged in a stack of shingles with alternate shingles offset in a zigzag manner to facilitate vertical electrical connections from a top of the electronic assembly to a bottom die of each shingle. The zigzag manner of stacking shingles forms a pattern of decreasing offsets facilitating alternating opposite vertical connections to the bottom die of each successive shingle.

Example 33 includes the electronic assembly of example 32 wherein the offset of shingles from each other is minimized to reduce the Y dimension of the electronic assembly yet still facilitate the vertical connections.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof, either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic assembly comprising:
    a plurality of electronic die arranged into shingles, each shingle having a multiple offset stacked die coupled by cascading connections;
    each shingle arranged in a stack of shingles with alternate shingles having die stacked in opposite directions and offset in a zigzag manner; and
    a plurality of direct conductive vertical connections formed only between the bottom die of each shingle to an exposed top surface of an overmold of the electronic assembly.

2. The electronic assembly of claim 1 wherein the zigzag manner of stacking shingles continue a pattern of decreasing offsets facilitating alternating opposite vertical connections to the bottom die of each successive shingle.

3. The electronic assembly of claim 1 wherein a y-dimension growth of the electronic assembly is defined by (T/S)*O, where T is the total number of die, S is the number of die per shingle, and O is the overhang of each die and offset of each shingle.

4. The electronic assembly of claim 3 wherein S is at least four.

5. The electronic assembly of claim 3 wherein there are at least four shingles.

6. An electronic assembly comprising:
    a plurality of offset zigzag shingle stacks of die such that a portion of each bottom die in each shingle stack is vertically exposed;
    a plurality of cascade electrical connections between adjacent die in each shingle stack; and
    a plurality of direct conductive vertical connections formed only between the bottom die of each shingle to an exposed top surface of an overmold of the electronic assembly.

7. The electronic assembly of claim 6 wherein a y-dimension growth of the electronic assembly is defined by (T/S)*O, where T is the total number of die, S is the number of die per shingle, and O is the overhang of each die and offset, of each shingle.

* * * * *